(12) United States Patent
Hsu et al.

(10) Patent No.: US 8,094,429 B2
(45) Date of Patent: Jan. 10, 2012

(54) MULTILAYER CAPACITORS AND METHODS FOR MAKING THE SAME

(75) Inventors: Chien-Min Hsu, Hsinchu (TW);
Min-Lin Lee, Hsinchu (TW);
Shinn-Juh Lai, Hsinchu (TW)

(73) Assignee: Industrial Technology Research Institute, Chutung, Hsinchu (TW)

( * ) Notice: Subject to any disclaimer, the term of this patent is extended or adjusted under 35 U.S.C. 154(b) by 395 days.

(21) Appl. No.: 12/488,780

(22) Filed: Jun. 22, 2009

(65) Prior Publication Data

US 2010/0321858 A1 Dec. 23, 2010

(51) Int. Cl.
*H01G 4/228* (2006.01)

(52) U.S. Cl. ............... 361/306.3; 361/301.4; 361/311; 361/313; 361/321.2; 361/306.1

(58) Field of Classification Search .............. 361/306.3, 361/306.1, 301.2, 301.4, 309, 311–313, 321.1, 361/321.2, 303–305
See application file for complete search history.

(56) References Cited

U.S. PATENT DOCUMENTS

| | | | |
|---|---|---|---|
| 5,079,069 A | | 1/1992 | Howard et al. |
| 5,835,338 A * | | 11/1998 | Suzuki et al. ............ 361/301.4 |
| 6,130,138 A * | | 10/2000 | Oh .............................. 438/393 |
| 6,532,143 B2 | | 3/2003 | Figueroa et al. |
| 6,621,682 B1 * | | 9/2003 | Takakuwa et al. ........ 361/306.3 |
| 6,885,541 B2 * | | 4/2005 | Otsuka et al. ............. 361/306.3 |
| 6,950,300 B2 * | | 9/2005 | Sutardja .................... 361/306.3 |
| 7,035,082 B2 * | | 4/2006 | Jow et al. .................. 361/306.3 |
| 7,046,502 B2 * | | 5/2006 | Murosawa et al. ........ 361/321.2 |
| 7,394,643 B2 * | | 7/2008 | Yamane et al. ............... 361/303 |
| 7,742,276 B2 | | 6/2010 | Hsu et al. |

FOREIGN PATENT DOCUMENTS

CN 101295585 A 10/2008

* cited by examiner

*Primary Examiner* — Nguyen T Ha
(74) *Attorney, Agent, or Firm* — Finnegan, Henderson, Farabow, Garrett & Dunner, LLP

(57) ABSTRACT

A capacitor device may include a first electrode, a second electrode, a third electrode, a first dielectric layer, and a second dielectric layer. The first electrode may be coupled with a first terminal of the capacitor device. The second electrode is under the first electrode and may be coupled with a second terminal of the capacitor device. The second electrode may be electrically isolated from the first electrode. The third electrode is under the first electrode and the second electrode and may be electrically isolated from the second electrode and electrically coupled with the first electrode. The first dielectric layer has a first dielectric constant and may be sandwiched between the first electrode and the second electrode. The second dielectric layer may have a second dielectric constant and may be sandwiched between the second electrode and the third electrode. In one embodiment, the second dielectric constant is at least five times larger than the first dielectric constant.

27 Claims, 19 Drawing Sheets

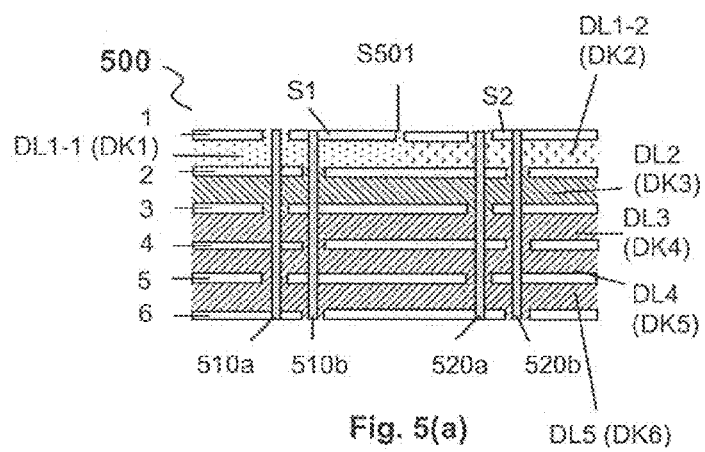
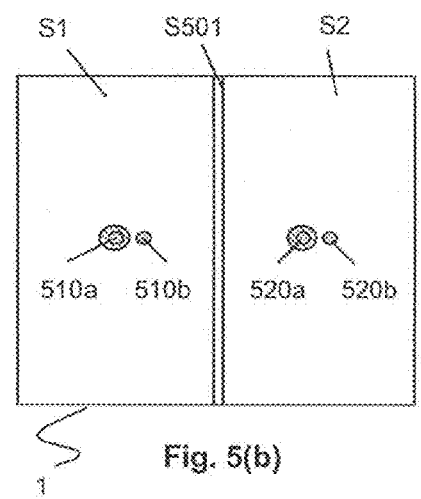
Fig. 5(a)  Fig. 5(b)
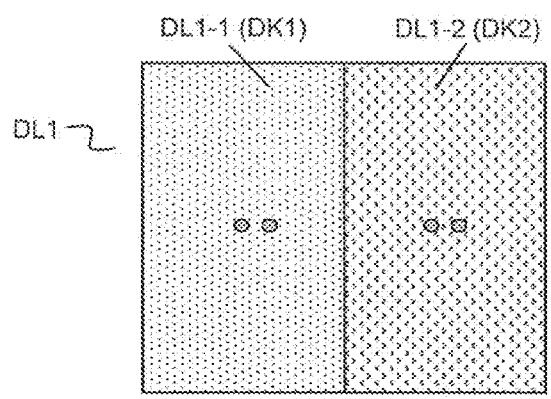
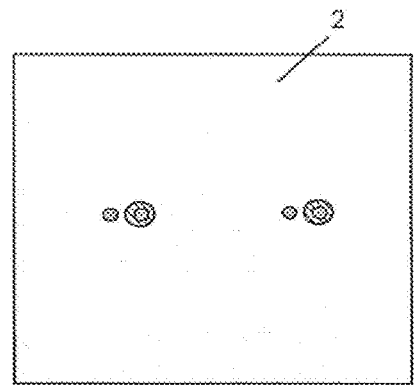
Fig. 5(c)  Fig. 5(d)

MULTILAYER CAPACITORS AND METHODS FOR MAKING THE SAME

TECHNICAL FIELD

The present disclosure relates generally to multilayer capacitors and, more particularly, to methods and apparatus for multilayer capacitors that may offer multiple resonant frequencies.

BACKGROUND

Capacitors have broad applications in the design and operation of electrical circuits. For example, capacitors have been used as noise-reduction or cancellation devices on printed circuit boards ("PCBs") and integrated circuits ("ICs") substrates. In some applications, capacitors may be surface-mount devices ("SMDs"), such as serving as decoupling capacitors or bypass capacitors for power input terminals. These capacitors may serve to absorb glitches, to reduce radio frequency ("RF") noise, to stabilize power supply, or to achieve a combination of multiple or other functions.

As semiconductor manufacturing technology continues to evolve, challenges increase for devices operating at high frequencies, such as 10 GHz or more. The increase in signal communication frequency or density also may increase signaling or switching interferences. Therefore, the power delivery system of ICs may need capacitors with high capacitance to reduce noise at low frequency and to offer low impedance paths to reduce noise and interference at high frequency. For example, multiple capacitors with different capacitance may be mounted on the surface of an IC substrate or PCB to reduce noises associated with power delivery system of ICs.

Each capacitor may have its characteristic impedance. When a capacitor is coupled with a signal having an operating frequency lower than the capacitor's resonant frequency, it may still have capacitive characteristics. However, when a capacitor is coupled with a signal having an operating frequency higher than the capacitor's resonant frequency, the capacitor may exhibit inductive characteristics. That is, a capacitor's impedance may increase as the system operating frequency increases. As a result, the capacitor may have little decoupling effect at high frequencies.

To provide decoupling effects or to eliminate undesirable noises for a power supply for ICs or circuitries, a system may be parallel with multiple capacitors, such as SMD capacitors with different capacitances, to reduce noise and glitches at different frequencies. However, as operating frequencies for ICs increase, the required number of SMD capacitors also increases to cover a broader frequency spectrum. Fitting more SMD capacitors on a PCB or an IC substrate can become a challenge due to the limited surface area of the PCB or substrate, especially in the case of portable devices.

As an alternative to the SMD design, PCBs or IC substrates may be designed with embedded capacitors. The design of capacitors embedded in PCBs, in certain applications, may reduce the loop inductance of wiring paths, provide higher capacitance(s), reduce the size of electronic package, or offer additional advantages or a combination of any these advantages. However, some challenges exist in the area of embedded capacitors. For example, the greater the capacitance, the lower the resonant frequency (or the lower the capacitor's impedance curve). In other words, merely providing a larger capacitance might not be able to absorb or reduce interference issues resulted from high-frequency noises or pulses. Although embedded and planar capacitors may be cut into several capacitors designed for absorbing or reducing noises at several frequency bands, the approach may reduce the capacitance values due to reduced areas of capacitor electrodes. Therefore, challenges may exist in providing embedded capacitors suitable for higher or wider frequency coverage of the capacitors noise-reduction (or "decoupling") effects.

The disclosed embodiments may overcome or be configured to overcome one or more of the problems associated with traditional capacitor designs.

BRIEF SUMMARY

In one exemplary embodiment, the present disclosure is directed to a capacitor device. The capacitor device may include a first electrode, a second electrode, a third electrode, a first dielectric layer, and a second dielectric layer. The first electrode may be coupled with a first terminal of the capacitor device. The second electrode is under the first electrode and may be coupled with a second terminal of the capacitor device. The second electrode may be electrically isolated from the first electrode. The third electrode is under the first electrode and the second electrode and may be electrically isolated from the second electrode and electrically coupled with the first electrode. The first dielectric layer has a first dielectric constant and may be sandwiched between the first electrode and the second electrode. The second dielectric layer may have a second dielectric constant and may be sandwiched between the second electrode and the third electrode. In one embodiment, the second dielectric constant is at least five times larger than the first dielectric constant.

In another exemplary embodiment, the present disclosure is directed to a capacitor device. The capacitor device may include a first electrode, a second electrode, a third electrode, a fourth electrode, a first dielectric layer, a second dielectric layer, and a third dielectric layer. The first electrode may be coupled with a first terminal of the capacitor device. The second electrode is under the first electrode and may be coupled with a second terminal of the capacitor device. The second electrode may be electrically isolated from the first electrode. The third electrode is under the first electrode and the second electrode and may be electrically isolated from the second electrode and electrically coupled with the first electrode. The first dielectric layer has a first dielectric constant and may be sandwiched between the first electrode and the second electrode. The second dielectric layer may have a second dielectric constant and may be sandwiched between the second electrode and the third electrode. In one embodiment, the second dielectric constant is no less than five times the first dielectric constant. The fourth electrode is under the third electrode and may be electrically isolated from the third electrode and be electrically coupled with the second electrode. The third dielectric layer has a third dielectric constant and may be sandwiched between the third electrode and the fourth electrode.

In another exemplary embodiment, the present disclosure is directed to a method for forming a capacitor device. The method may include: providing a first electrode; providing a second electrode under the first electrode, the second electrode being electrically isolated from the first electrode; and forming a first dielectric layer between the first electrode and the second electrode. The first dielectric layer has a first dielectric constant. The method may further include: providing a third electrode under the first electrode and the second electrode, the third electrode being electrically isolated from the second electrode and being electrically coupled with the first electrode; and forming a second dielectric layer between the second electrode and the third electrode. The second dielectric layer has a second dielectric constant, and the second dielectric constant may be at least five times larger than the first dielectric constant. In some embodiments, the method may further include forming a first electrical coupling between the first electrode and a first terminal of the capacitor device; and forming a second electrical coupling between the second electrode and a second terminal of the capacitor device.

DETAILED DESCRIPTION

Figure 1A:
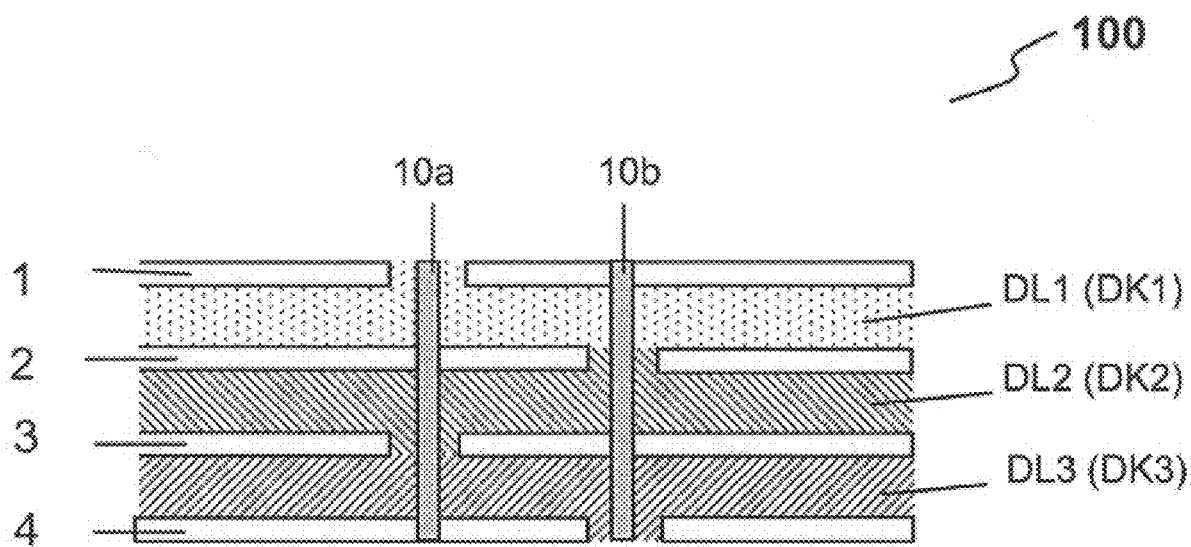
FIG. 1(a) illustrates a cross-sectional view of an exemplary multilayer capacitor with four layers of electrodes, consistent with disclosed embodiments.

FIG. 1(a) illustrates a cross-sectional view of an exemplary multilayer capacitor with four layers of electrodes. Capacitor 100 may have four layers of electrodes, including electrodes 1, 2, 3, and 4 as illustrated. Electrodes 1-4 may be formed from conductive material. In one embodiment, one or more of the four layers of electrodes may be made of or include copper foil. As shown in FIG. 1(a), electrode 1 may be the top layer of electrode and electrodes 2-4 may be stacked under electrode 1. Dielectric layer DL1 may be sandwiched between electrodes 1 and 2 and has dielectric constant DK1. Similarly, dielectric layer DL2 may be sandwiched between electrodes 2 and 3, and dielectric layer DL3 may be sandwiched between electrodes 3 and 4. Dielectric layers DL2 and DL3 respectively may have dielectric constants DK2 and DK3. In one embodiment, dielectric constant DK2 may be at least five times larger than DK1. Via 10a may be electrically coupled with electrodes 2 and 4 and electrically isolated from electrodes 1 and 3. Via 10b may be electrically coupled with electrodes 1 and 3 and electrically isolated from electrodes 2 and 4. The capacitor device as illustrated may be a combination of multiple capacitors having different capacitive or impedance effects. To couple the capacitor device with other circuitry or another device, two or more terminals may be provided. In one embodiment, a first terminal may be electrically coupled with electrodes 1 and 3, and a second terminal may be electrically coupled with electrodes 2 and 4. In some embodiments, vias, interconnects, their extensions, or any other conductive couplings or structures may serve as the first and second terminals. The capacitor device may be coupled with an IC or circuitry, such as the power or other terminals of the IC or circuitry, through the first and second terminals.

Figure 1B:
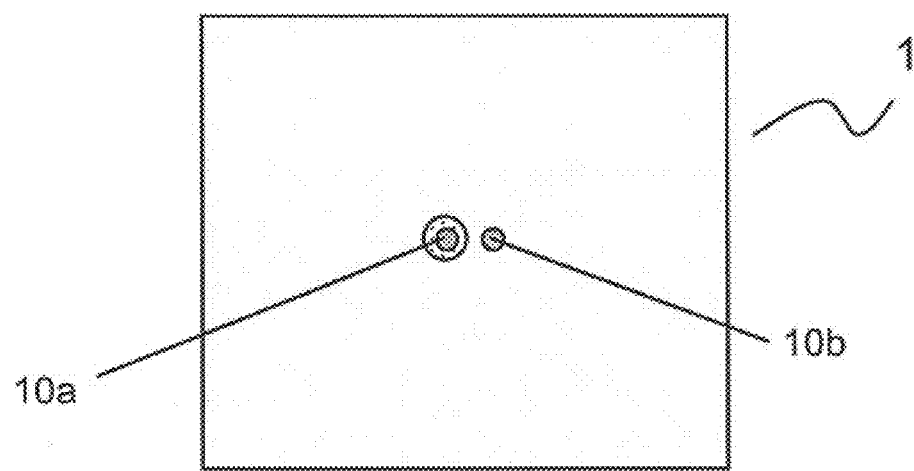
FIG. 1(b) illustrates a top view of the first electrode layer for the exemplary multilayer capacitor illustrated in FIG. 1(a)

FIG. 1(b) illustrates a top view of electrode 1 of capacitor 100 illustrated in FIG. 1(a). As shown in FIG. 1(b), via 10a is not coupled with electrode 1 and can be viewed from the top as passing through an opening in electrode 1. Via 10b is coupled with electrode 1. In some embodiments, via 10a may be electrically coupled with a power source, such as a positive voltage input, and via 10b may be electrically coupled with ground or a negative voltage input.

Figure 2:
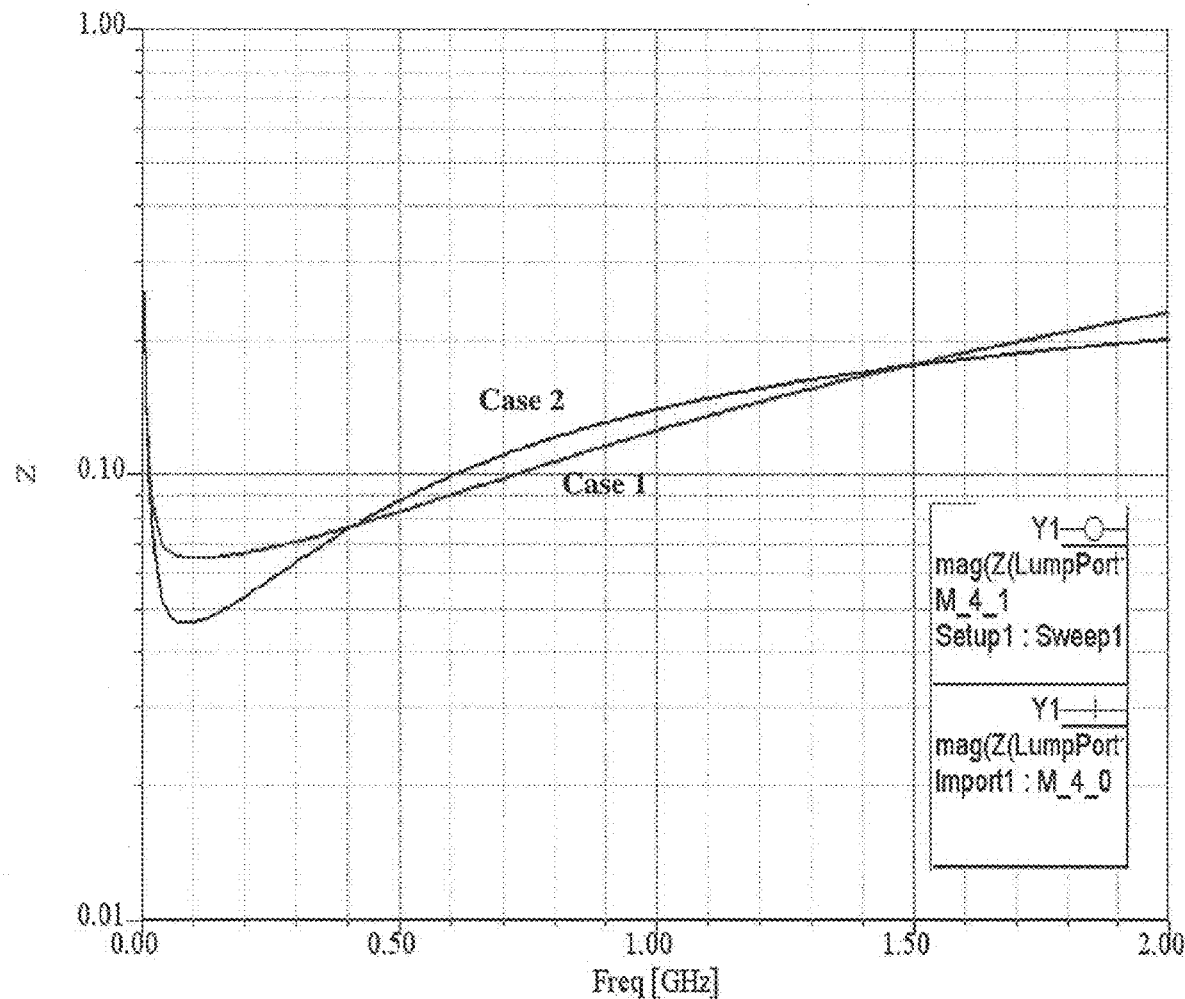
FIGS. 2(a)-(b) are exemplary impedance curves of a multilayer capacitor illustrated in FIG. 1(a), consistent with disclosed embodiments.
Figure 2:
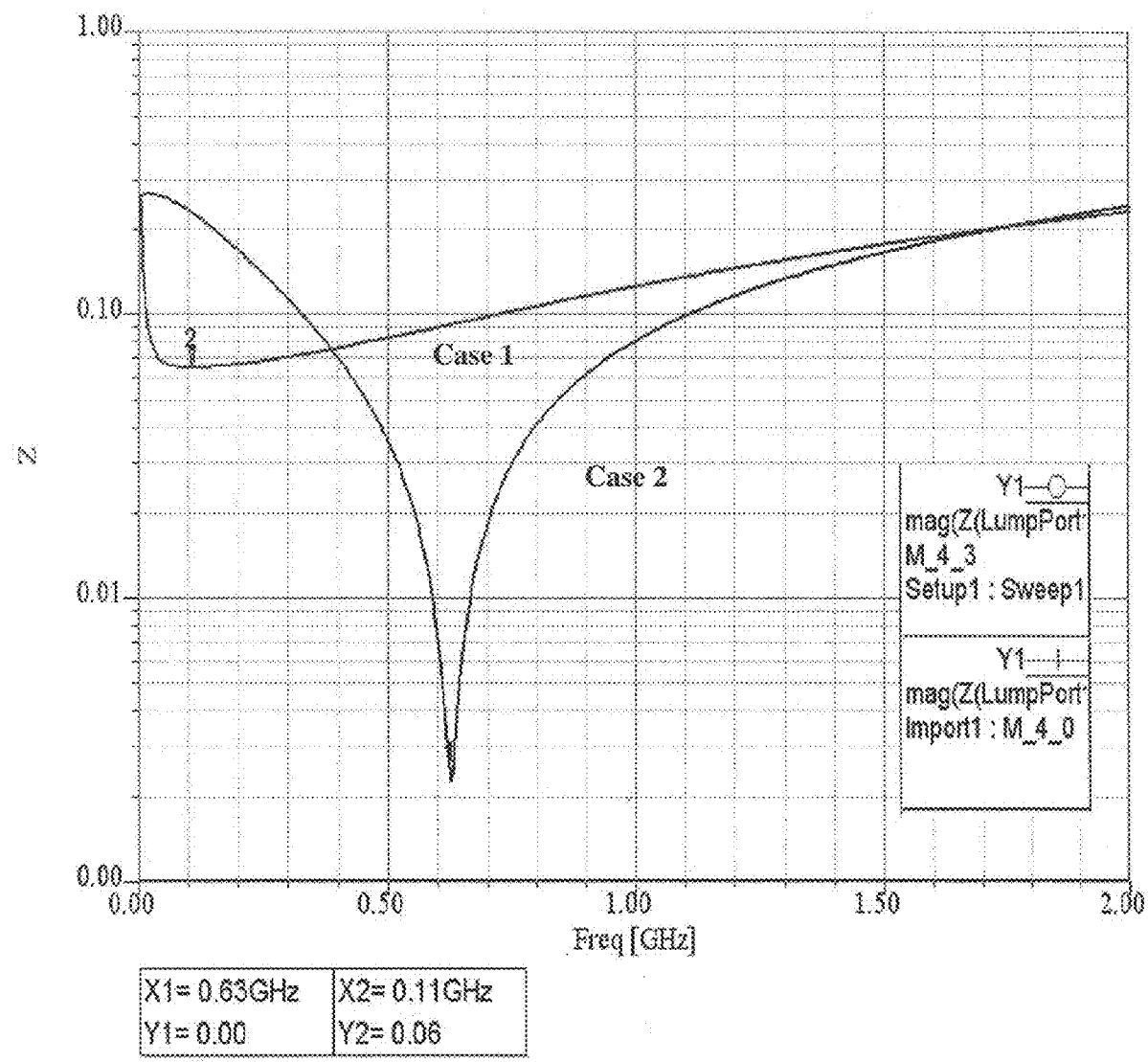

FIGS. 2(a)-(b) are exemplary impedance curves based on software-simulation of the characteristics of capacitor 100 illustrated in FIG. 1(a). The impedance curves in FIGS. 2(a)-(b) illustrate possible effects on the impedance of capacitor 100 from simulating the different values of dielectric constants DK1, DK2 and DK3. In FIG. 2(a), an exemplary impedance curve is illustrated for case 1, for which DK1=DK2=DK3=75. Another exemplary impedance curve is illustrated for case 2, for which DK1=21.7, DK2=75, and DK3=110. Although dielectric constants DK1 and DK3 may be different, both cases 1 and 2 result in the same capacitance value of 123 nF in one embodiment. In this embodiment, cases 1 and 2 have similar resonant frequencies of near 0.1 GHz.

FIG. 2(b) shows exemplary impedance curves for a varied scenario, in which dielectric constant DK2 is 4 and DK1 is 147. Although Case 1 and Case 2 still yield about the same capacitance, with 123 nF for Case 1 and 124 nF for Case 2, the impedance curve of case 2 has a much larger resonant frequency of about 0.62 GHz compared to about 0.1 GHz for Case 1. According to the above results, when DK2≧5*DK1, capacitor 100 may have a higher resonant frequency without significant variation in its capacitance.

Figure 3A:
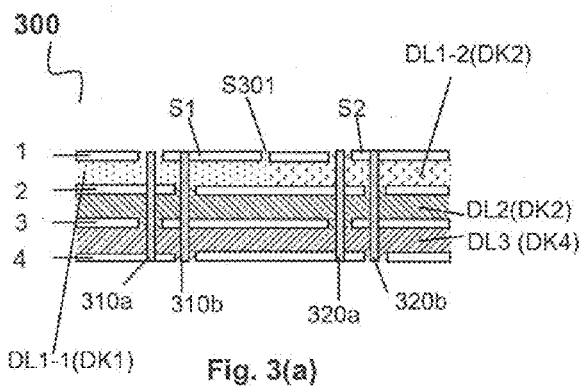
FIG. 3(a) illustrates a cross-sectional view of an exemplary multilayer capacitor with four layers of electrodes, consistent with disclosed embodiments.

FIG. 3(a) illustrates a cross-sectional view of an exemplary multilayer capacitor with four layers of electrodes. Capacitor 300 may have four layers of electrodes, including electrode 1, 2, 3, and 4 as illustrated. Electrodes 1-4 may be formed from conductive material. FIG. 3(i) illustrates three-dimensional view of capacitor 300 illustrated in FIG. 3(a). In one embodiment, one or more of the four layers of electrodes may be made of or include copper foil. In one embodiment, electrode 1 may have two physically separated sections: S1 and S2. S1 and S2 may be electrically isolated by slot S301, which may be filled with dielectric materials. The dielectric layer DL1 may be sandwiched between electrodes 1 and 2, and may comprise two sections: DL1-1 and DL1-2, respectively having dielectric constants DK1 and DK2. DK1 and DK2 may have different values. As shown in FIG. 3(a), DL1-1 may be placed under section S1 of electrode 1, and DL1-2 may be placed under section S2 of electrode 1. Similarly, dielectric layer DL2 may be sandwiched between electrodes 2 and 3, and dielectric layer DL3 may be sandwiched between electrodes 3 and 4. Dielectric layers DL2 and DL3 respectively may have dielectric constants DK3 and DK4. In one embodiment, DK3 may be at least five times larger than at least one of DK1 and DK2. Vias 310a and 320a may be electrically coupled with electrodes 2 and 4 and electrically isolated from electrodes 1 and 3. Vias 310b and 320b may be electrically coupled with electrodes 1 and 3 and electrically isolated from electrodes 2 and 4. In some embodiments, vias 310a and 320a may be electrically coupled with a power source, such as a positive voltage input, and vias 310b and 320b may be electrically coupled with ground or a negative voltage input.

Figure 3B:
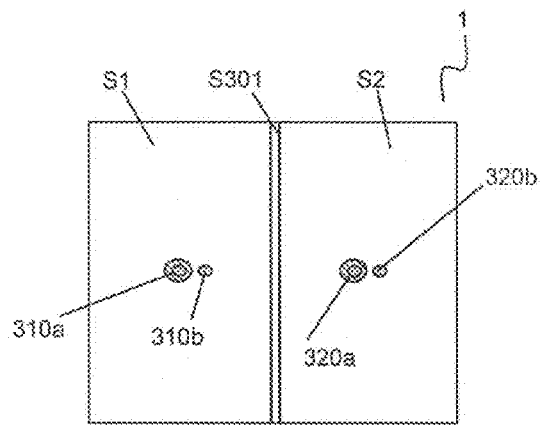
FIGS. 3(b), (d), (e), and (g) illustrate the top views of several layers of electrodes of the multilayer capacitor illustrated in FIG. 3(a), consistent with disclosed embodiments.
Figure 3C:
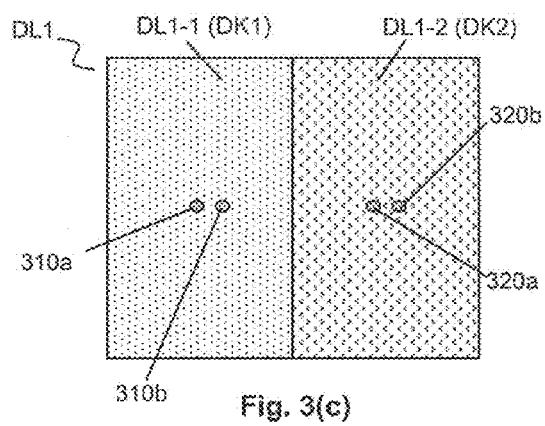
FIGS. 3(c), (f), and (h) illustrate the top views of several dielectric layers of the multilayer capacitor illustrated in FIG. 3(a), consistent with disclosed embodiments.
Figure 3D:
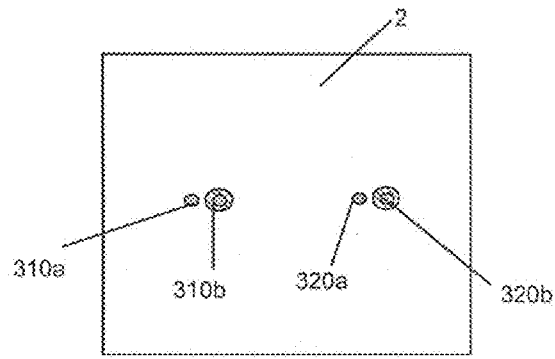
FIG. 3(i) illustrates three-dimensional view of the capacitor illustrated in FIG. 3(a).
Figure 3E:
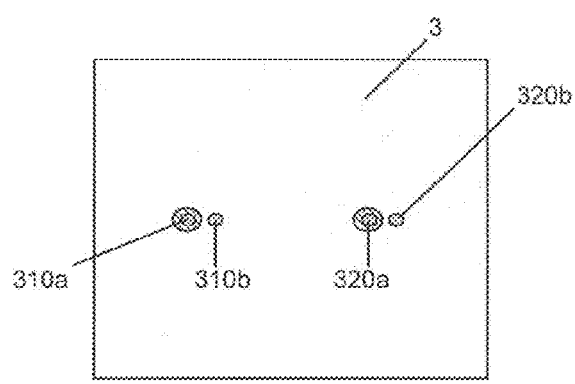
Figure 3F:
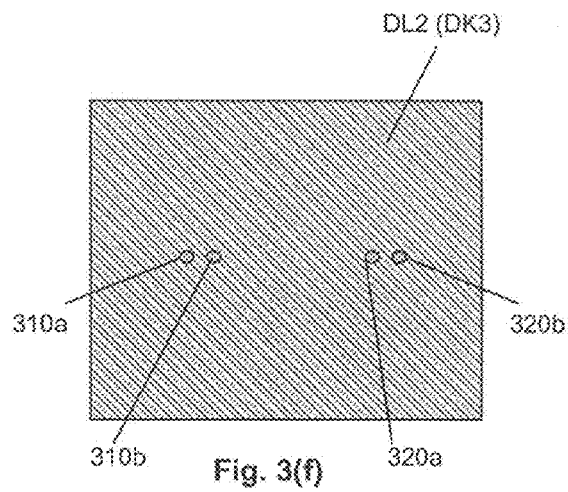
Figure 3G:
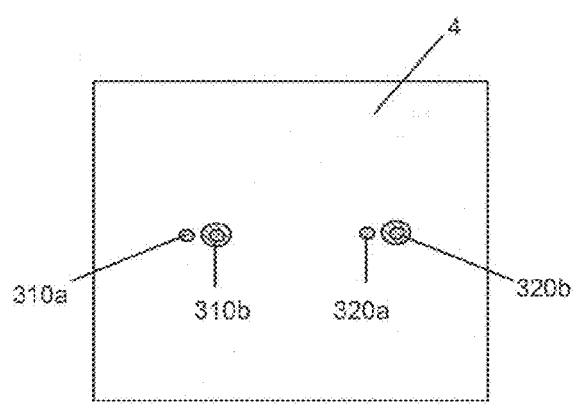
Figure 3H:
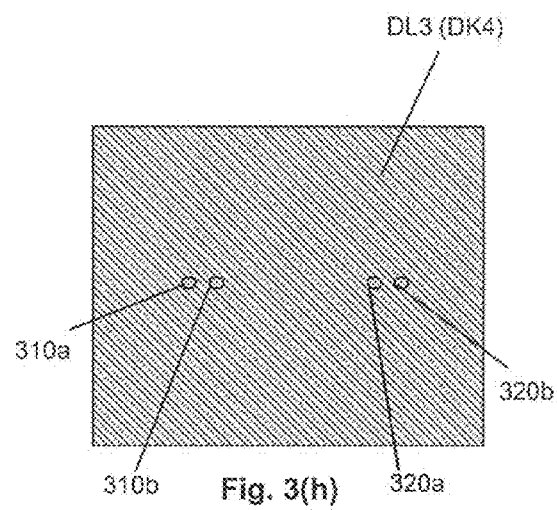
Figure 3I:
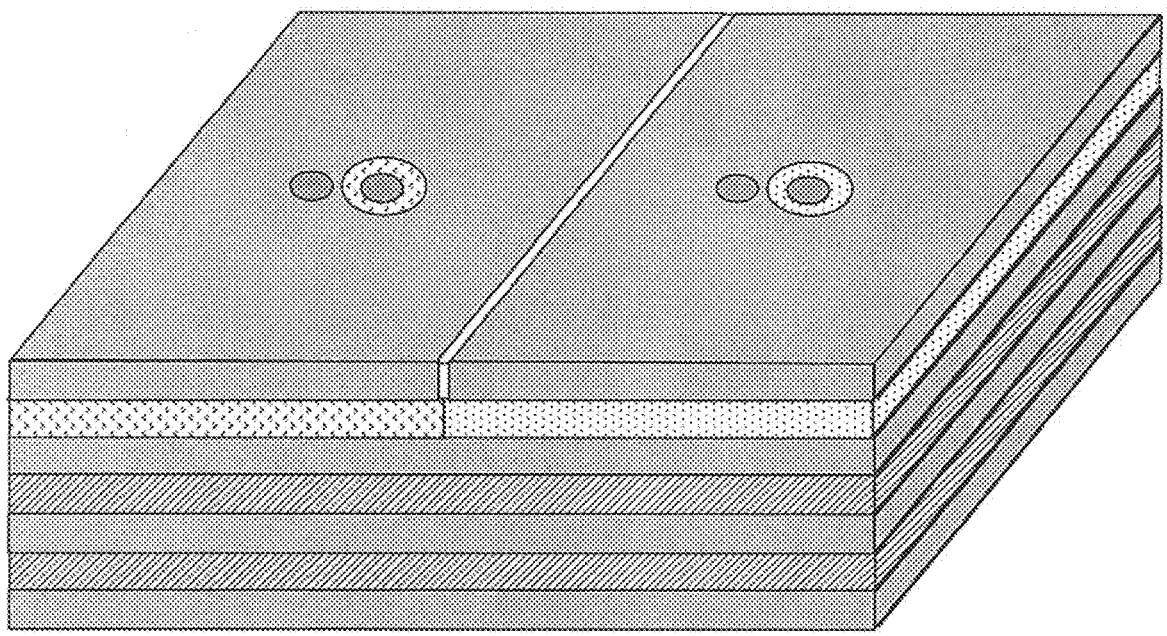

FIGS. 3(b), (d), (e) and (g) illustrate top views of electrodes 1, 2, 3 and 4 of capacitor 300 illustrated in FIG. 3(a). FIG. 3(c) illustrates top view of the dielectric layer DL1, which may comprise sections DL1-1 and DL1-2 of capacitor 300. As shown in FIGS. 3(b) and (e), vias 310b and 320b are respectively electrically coupled with sections S1 and S2 of electrode 1 and electrode 3, but vias 310a and 320a are not electrically coupled with electrodes 1 and 3. One isolation-ring or insulative opening on electrode 1 may be placed in section S1 and the other isolation-ring or insulative opening formed on electrode 1 may be placed in section S2 of electrode 1. As shown in FIGS. 3(d) and (g), vias 310a and 320a are electrically coupled with electrodes 2 and 4, but vias 310b and 320b are not electrically coupled with and insulated from electrodes 2 and 4 and can be viewed from the top as passing through two isolation-rings or insulative openings formed on electrodes 2 and 4. FIGS. 3(c), (f), and (h) show that all four vias of capacitor 300 may be coupled (non-conductively, in this embodiment) with the dielectric layers, such as DL1 and DL2, which are sandwiched between every two layers of the four electrodes.

Figure 4A:
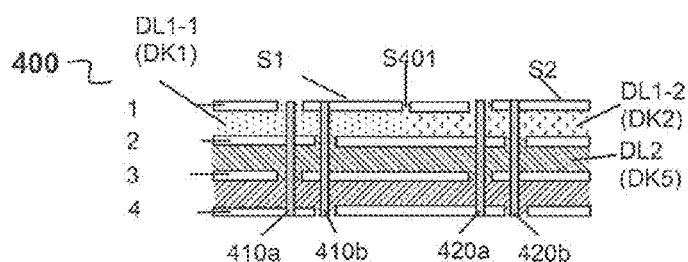
FIG. 4(a) illustrates a cross-sectional view of an exemplary multilayer capacitor with four layers of electrodes, consistent with disclosed embodiments.
Figure 4B:
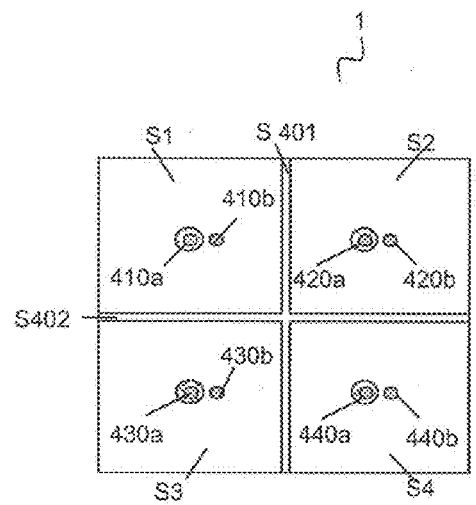
FIGS. 4(b), (d), (e), and (g) illustrate the top views of several layers of electrodes of the multilayer capacitor illustrated in FIG. 4(a), consistent with disclosed embodiments.
Figure 4C:
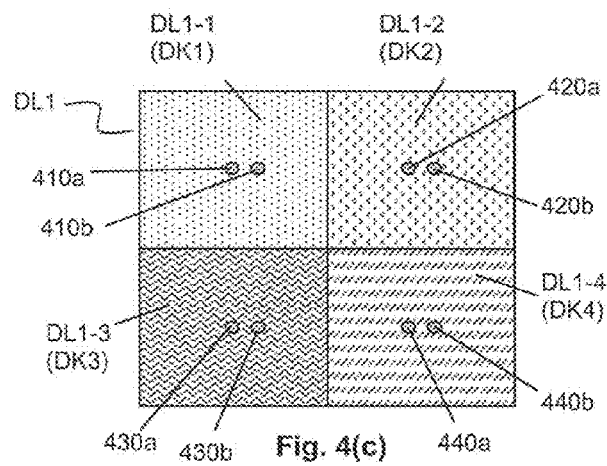
FIGS. 4(c), (f), and (h) illustrate the top views of several dielectric layers of the multilayer capacitor illustrated in FIG. 4(a), consistent with disclosed embodiments.
Figure 4D:
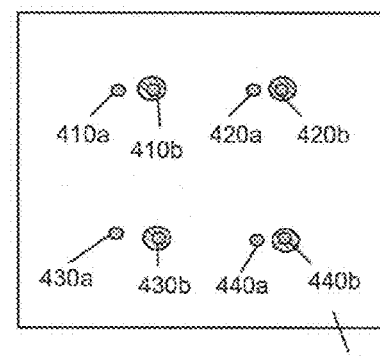
FIG. 4(i) illustrates a three-dimensional view of the capacitor illustrated in FIG. 4(a).
Figure 4E:
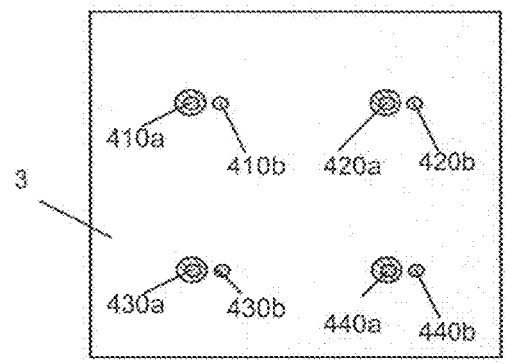
Figure 4F:
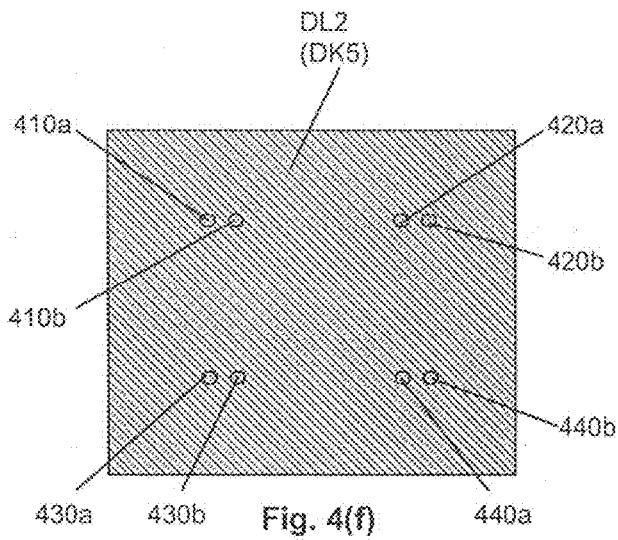
Figure 4G:
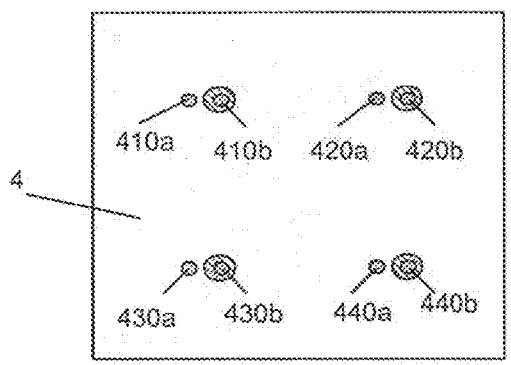
Figure 4H:
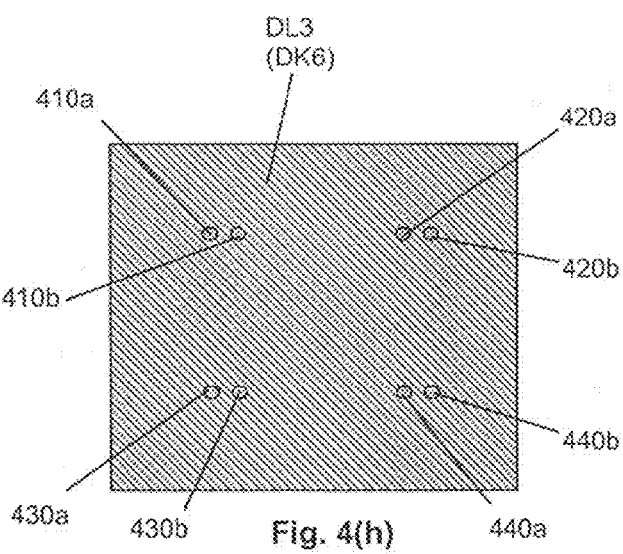
Figure 4I:
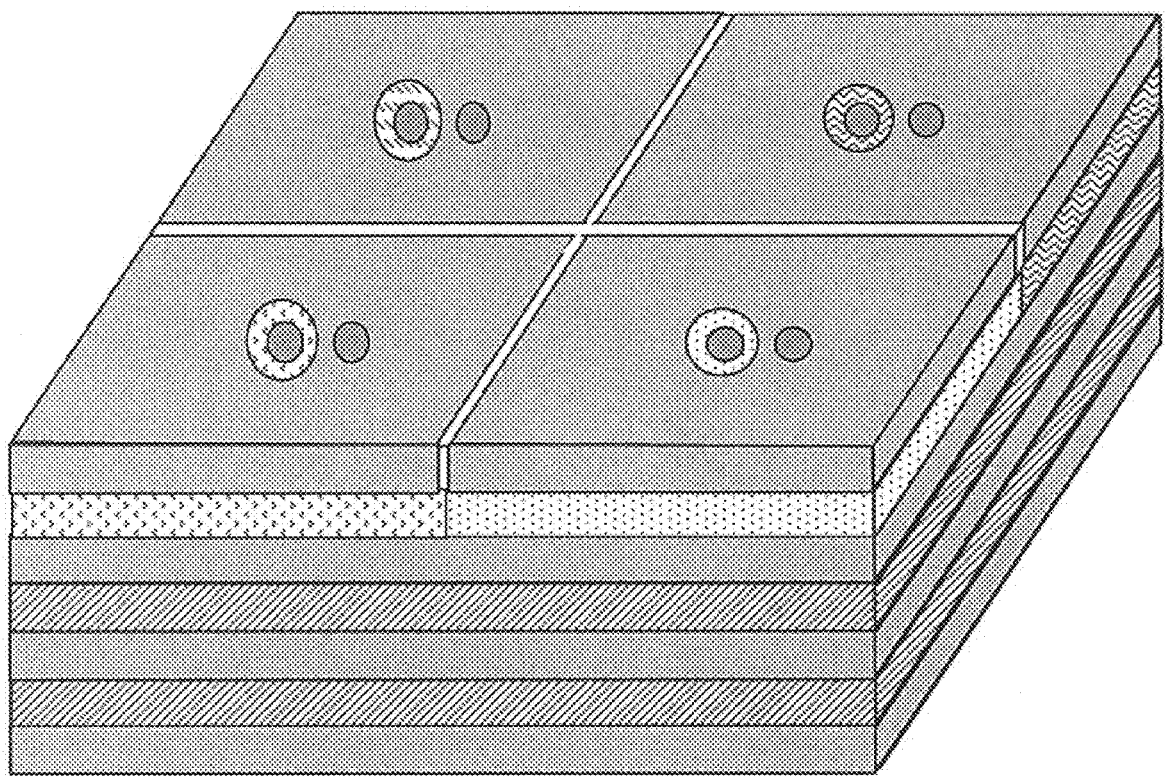

FIG. 4(a) illustrates a cross-sectional view of an exemplary multilayer capacitor with four layers of electrodes. FIG. 4(i) illustrates a three-dimensional view of capacitor 400 illustrated in FIG. 4(a). Capacitor 400 may be structurally similar to Capacitor 300, having four layers of electrodes with a dielectric layer sandwiched between every two layers of electrodes. The structural difference between capacitor 400 and capacitor 300 is that electrode 1 of capacitor 400 may have four physically separated sections: S1, S2, S3 and S4, as illustrated in FIG. 4(b). The four sections of electrode 1 may be electrically isolated by slots S401 and S402, each slot may be filled with dielectric materials. Vias 410a, 420a, 430a and 440a may be electrically coupled with electrodes 2 and 4, and electrically isolated with electrodes 1 and 3. Vias 410b, 420b, 430b, and 440b may be electrically coupled with electrodes 1 and 3, and electrically isolated with electrodes 2 and 4.

FIGS. 4(b), (d), (e) and (g) respectively illustrate top views of electrodes 1, 2, 3 and 4 of capacitor 400 illustrated in FIG. 4(a). FIG. 4(c) illustrates top view of the dielectric layer DL1, which may comprise sections DL1-1, DL1-2, DL1-3 and DL1-4 of capacitor 400. The four sections of dielectric layer DL1 respectively may have dielectric constants DK1, DK2, DK3 and DK4. As shown in FIGS. 4(a)-(c), DL1-1 maybe placed under section S1, DL1-2 may be placed under section S2, DL1-3 may be placed under section S3 and DL1-4 may be placed under section S4. In one embodiment, at least two of dielectric constants DK1, DK2, DK3 and DK4 have different values. As shown in FIG. 4(a), dielectric layer DL2 may have dielectric constant DK5. In one embodiment, dielectric constant DK5 may be at least five times larger than at least one of DK1, DK2, DK3 and DK4.

As shown in FIGS. 4(b) and (e), vias 410b, 420b, 430b and 440b are respectively electrically coupled with sections S1, S2, S3 and S4 of electrode 1 and electrode 3, and vias 410a, 420a, 430a and 440a are isolated with electrodes 1 and 3 by isolation-rings or insulative openings. Each one of the four isolation-rings or insulative openings formed on electrode 1 may be placed in each of the four sections of electrode 1. As shown in FIGS. 4(d) and (g), vias 410a, 420a, 430a and 440a are electrically coupled with electrodes 2 and 4, and vias 410b, 420b, 430b and 440b are electrically isolated from electrodes 2 and 4. FIGS. 4(c), (f), and (h) show that all eight vias of capacitor 400 may be coupled (non-conductively) with the dielectric layers (such as DL1 and DL2 as illustrated), which are sandwiched between every two layers of the four electrodes. In some embodiments, vias 410a, 420a, 430a and 440a may be electrically connected to a power source or a power plane and vias 410b, 420b, 430b and 440b may be electrically connected to ground or a ground plane.

Figure 5E:
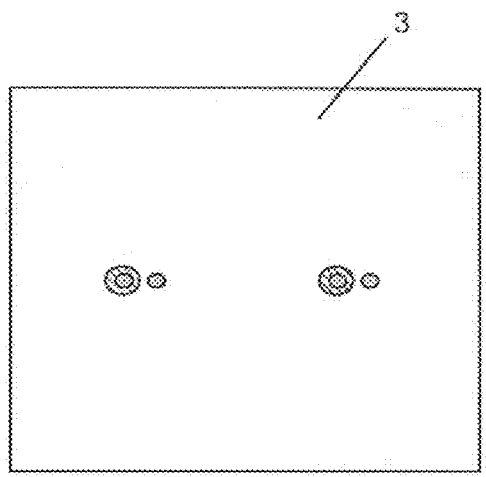
FIG. 5(a) illustrates a cross-sectional view of an exemplary multilayer capacitor with six layers of electrodes, consistent with disclosed embodiments.
FIGS. 5(b), (d), (e), (g), (h), and (i) illustrate the top views of four layers of electrodes of the multilayer capacitor illustrated in FIG. 5(a), consistent with disclosed embodiments.
FIGS. 5(c) and (f) illustrate the top views of several dielectric layers of the multilayer capacitor illustrated in FIG. 5(a), consistent with disclosed embodiments.

FIG. 5(a) illustrates a cross-sectional view of an exemplary multilayer capacitor with six layers of electrodes. Capacitor 500 is similar to capacitor 300, but may have two additional layers of electrodes. Capacitor 500 may have six layers of electrodes: electrodes 1, 2, 3, 4, 5 and 6, which may be conductive material. In one embodiment, one or more of the six layers of electrodes may be made of or include copper foil. In one embodiment, electrode 1 may have two physically separated sections: S1 and S2. S1 and S2 may be electrically isolated by slot S501 which may be filled with dielectric materials. The dielectric layer DL1 may be sandwiched between electrodes 1 and 2, and may comprise two sections: DL1-1 and DL1-2, respectively having dielectric constants DK1 and DK2. DK1 and DK2 may have different values. As shown in FIG. 5(a), DL1-1 may be placed under section S1 of electrode 1, and DL1-2 may be placed under section S2 of electrode 1. Similarly, dielectric layer DL2 may be sandwiched between electrodes 2 and 3, dielectric layer DL3 may be sandwiched between electrodes 3 and 4, dielectric layer DL4 may be sandwiched between electrodes 4 and 5, and dielectric layer DL5 may be sandwiched between electrodes 5 and 6. Dielectric layers DL2-DL5 respectively may have dielectric constants DK3-DK6. In one embodiment, DK3 may be at least five times larger than at least one of DK1 and DK2. Vias 510a and 520a maybe electrically coupled with electrodes 2, 4 and 6 and electrically isolated from electrodes 1, 3 and 5. Vias 510b and 520b may be electrically coupled with electrodes 1, 3 and 5 and electrically isolated from electrodes 2, 4 and 6. In some embodiments, vias 510a and 520a may be electrically coupled with a power source, such as a positive voltage input, and vias 510b and 520b may be electrically coupled with ground or a negative voltage input.

Figure 5F:
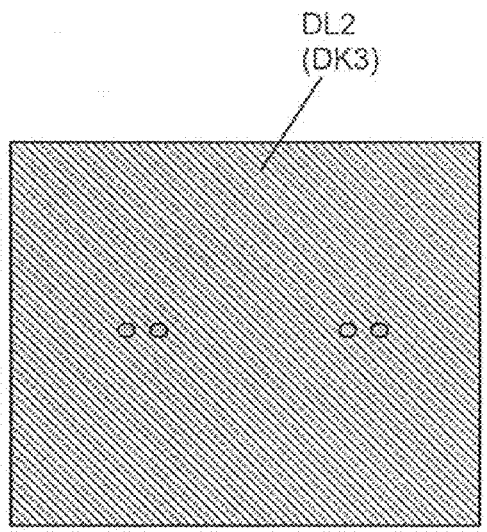
Figure 5G:
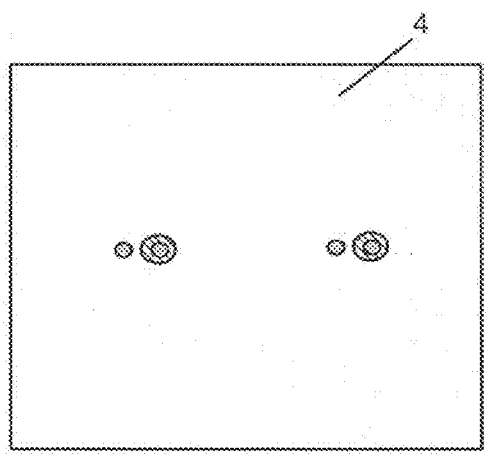
Figure 5H:
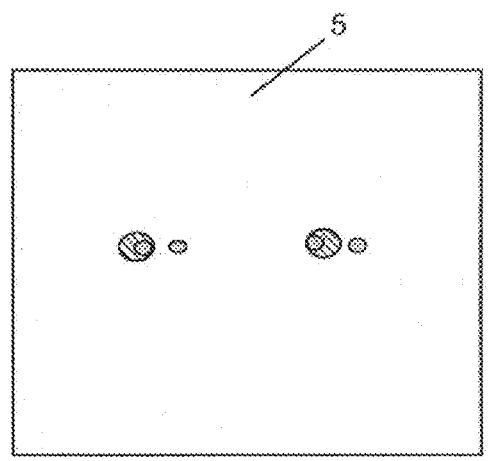
Figure 5I:
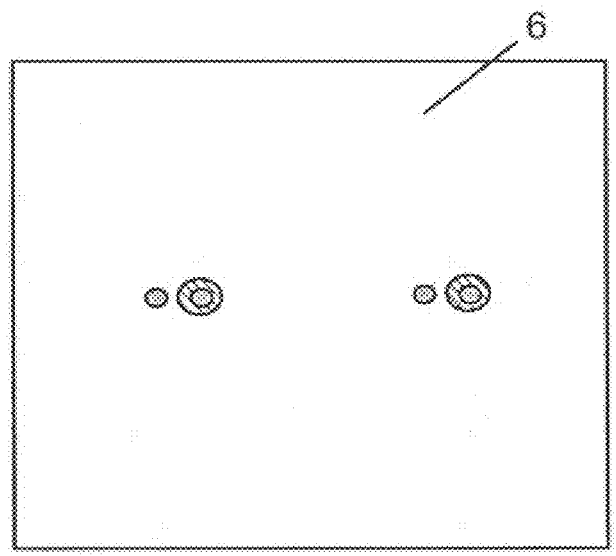

FIGS. 5(b), (d), (e), (g), (h) and (i) respectively illustrate top views of electrodes 1, 2, 3, 4, 5 and 6 of capacitor 500 illustrated in FIG. 5(a). FIG. 5(c) illustrates top view of the dielectric layer DL1, which may comprise sections DL1-1 and DL1-2 of capacitor 300. As shown in FIGS. 5(b), (e) and (h), vias 510b and 520b are respectively coupled with sections S1 and S2 of electrodes 1, 3 and 5, and vias 510a and 520a are electrically isolated from electrodes 1, 3 and 5. One isolation-ring or insulative opening formed on electrode 1 may be placed in section S1 and the other isolation-ring or insulative opening formed on electrode 1 may be placed in section S2 of electrode 1. As shown in FIGS. 5(d), (g) and (i), vias 510a and 520a are coupled with electrodes 2, 4 and 6, and vias 510b and 520b are isolated with electrodes 2, 4 and 6. FIGS. 5(c) and (f) show that all four vias of capacitor 500 may be coupled (non-conductively) with the dielectric layers (such as DL1 and DL2 as illustrated), which are sandwiched between every two layers of the six electrodes. The dielectric layers DL3, DL4, and DL5 are respectively DK4, DK5 and DK6 and may have a structure as illustrated in FIG. 5(f).

Figure 6A:
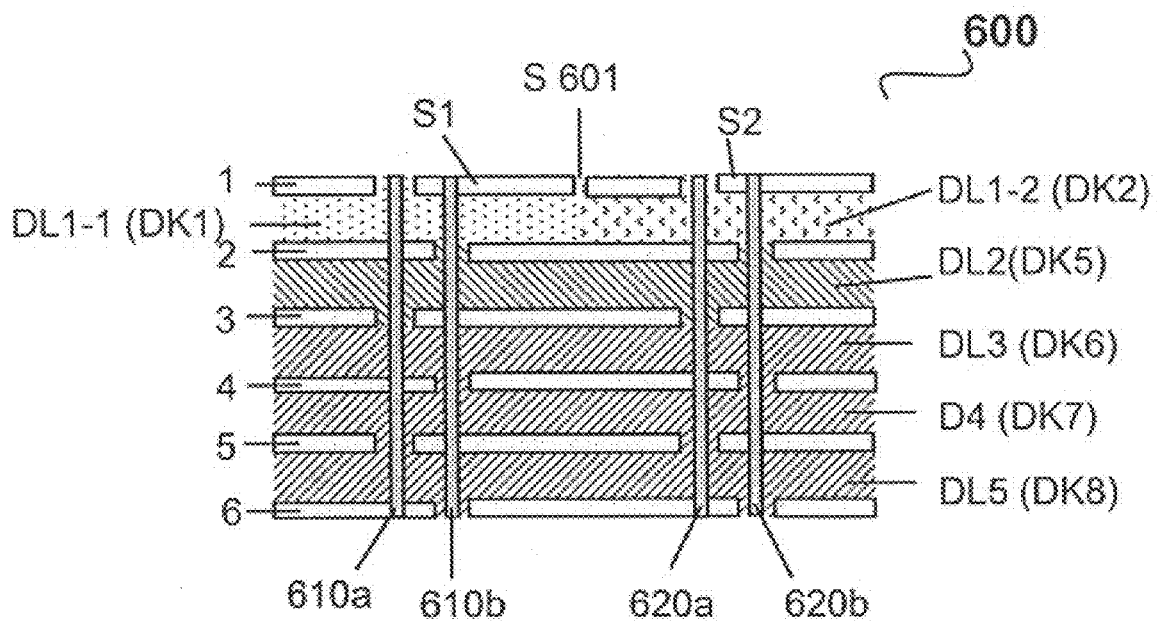
FIG. 6(a) illustrates a cross-sectional view of an exemplary multilayer capacitor with six layers of electrodes, consistent with disclosed embodiments.
Figure 6B:
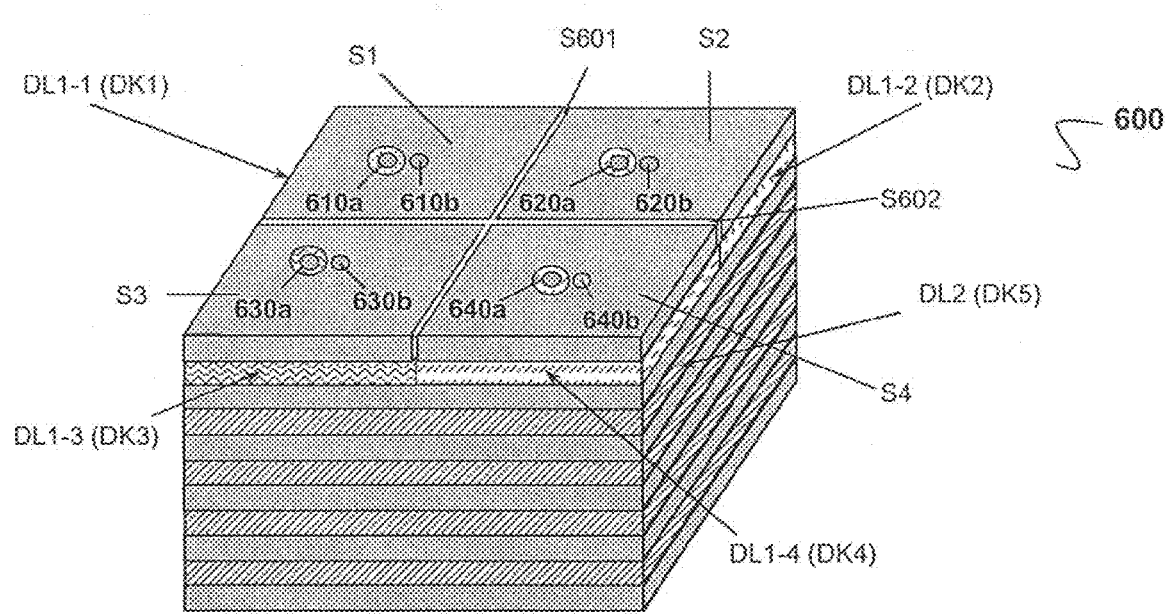
FIG. 6(b) illustrates a cross-sectional and three dimensional view of the multilayer capacitor illustrated in FIG. 6(a), consistent with disclosed embodiments.

FIG. 6(a) illustrates a cross-sectional view of an exemplary multilayer capacitor with six layers of electrodes. Capacitor 600 is structurally similar to capacitor 400, but may have two additional layers of electrodes. FIG. 6(b) illustrates a cross-sectional and three dimensional view of capacitor 600 illustrated in FIG. 6(a). As shown in FIGS. 6(a) and (b), electrode 1 of Capacitor 600 may have four physically separated sections: S1, S2, S3 and S4, and the four sections of electrode 1 may be electrically isolated by slots S601 and S602, each slot may be filled with dielectric materials. Vias 610a, 620a, 630a and 640a may be coupled with electrodes 2, 4 and 6, and isolated with electrodes 1, 3 and 5. Vias 610b, 620b, 630b, and 640b may be coupled with electrodes 1, 3 and 5, and isolated with electrodes 2, 4 and 6.

Figure 6C:
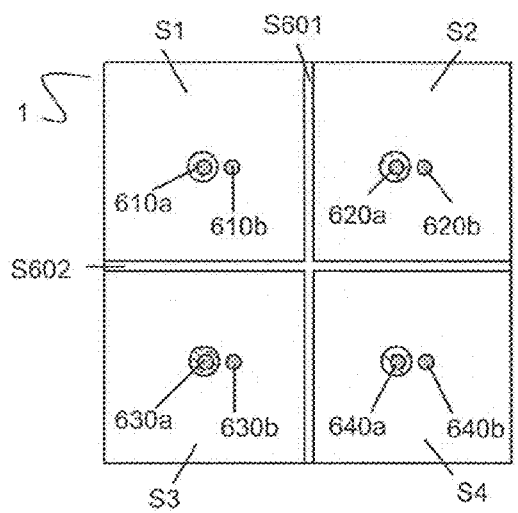
FIGS. 6(c), (e), (f), (h), (i), and (j) illustrate top views of six layers of electrodes of the multilayer capacitor illustrated in FIG. 6(a), consistent with disclosed embodiments.
Figure 6D:
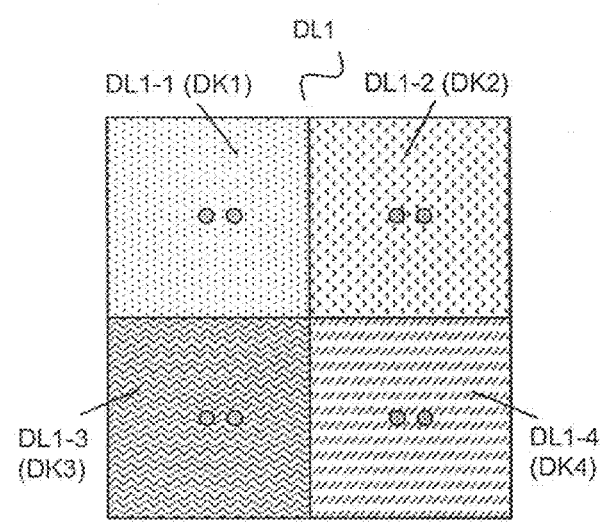
FIGS. 6(d) and (g) illustrate top views of two dielectric layers of the multilayer capacitor illustrated in FIG. 6(a), consistent with disclosed embodiments.

FIGS. 6(c), (e), (f), (h), (i) and (j) respectively illustrate top views of electrodes 1, 2, 3, 4, 5, and 6 of capacitor 600 illustrated in FIG. 6(a). FIG. 6(d) illustrates top view of the dielectric layer DL1, which may comprise sections DL1-1, DL1-2, DL1-3 and DL1-4 of capacitor 600. The four sections of dielectric layer DL1 respectively may have dielectric constants DK1, DK2, DK3 and DK4. As shown in FIGS. 6(a) and (b), DL1-1 maybe placed under section S1, DL1-2 may be placed under section S2, DL1-3 may be placed under section S3 and DL1-4 may be placed under section S4. In one embodiment, at least two of dielectric constants DK1, DK2, DK3 and DK4 have different values. As shown in FIG. 6(a), dielectric layer DL2, sandwiched between electrodes 2 and 3, may have dielectric constant DK5. Dielectric layer DL3, sandwiched between electrodes 3 and 4, may have dielectric constant DK6. Dielectric layer DL4, sandwiched between electrodes 4 and 5, may have dielectric constant DK7. Dielectric layer DL5, sandwiched between electrodes 5 and 6, may have dielectric constant DK8. In one embodiment, dielectric constant DK5 may be at least five times larger than at least one of DK1, DK2, DK3 and DK4. DK5, DK6, and DK7 may have the same dielectric constant. However, other variations may also be possible depending on the applications and the desired effects of capacitor 600.

Figure 6E:
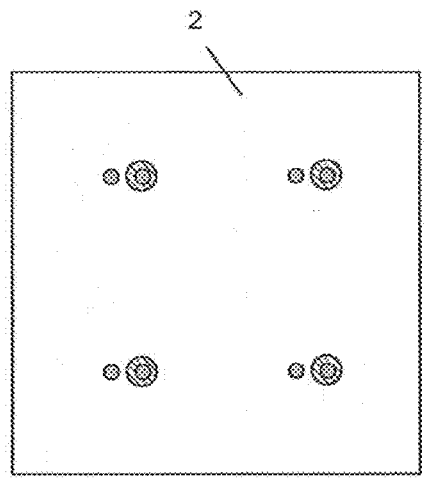
Figure 6F:
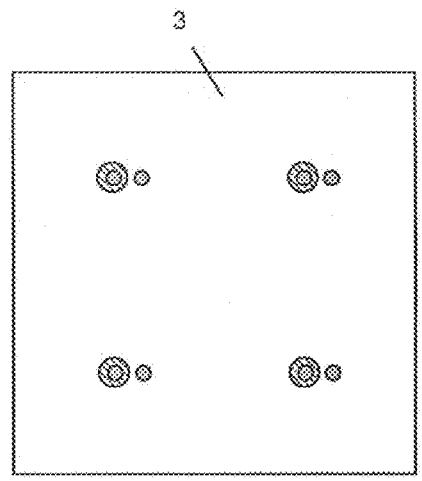
Figure 6G:
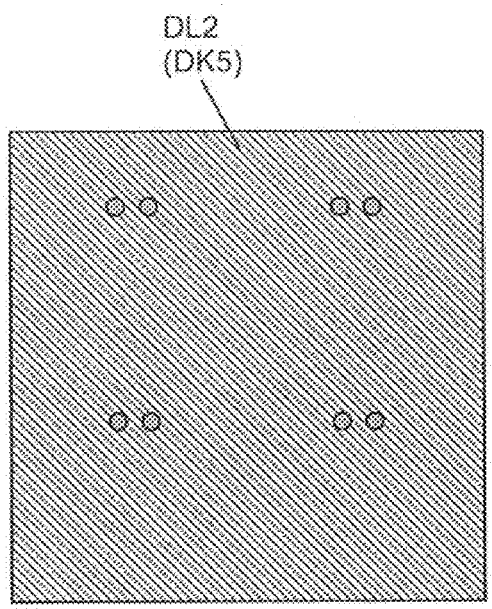
Figure 6H:
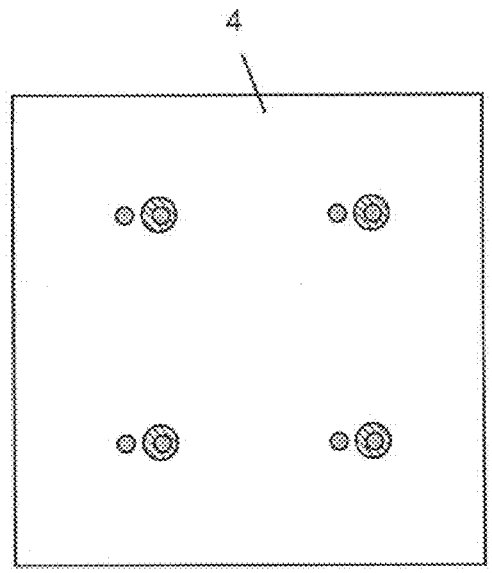
Figure 6I:
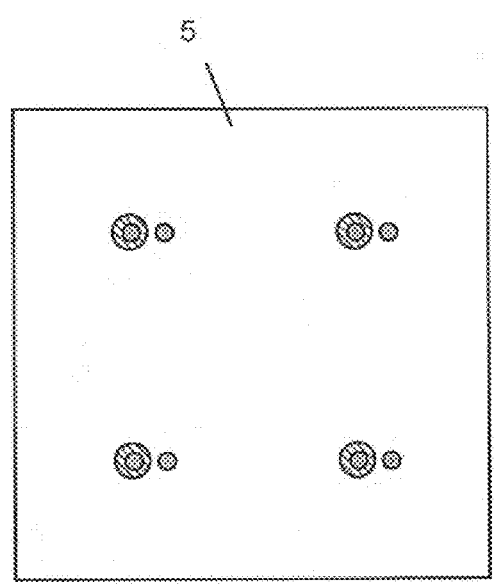
Figure 6J:
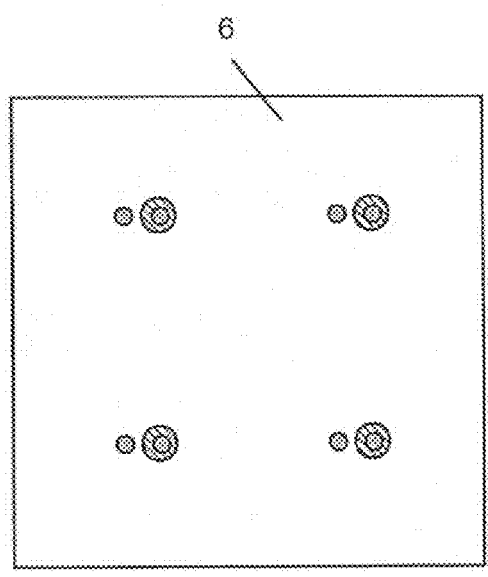

As shown in FIGS. 6(c), (f) and (i), vias 610b, 620b, 630b and 640b are respectively coupled with sections S1, S2, S3 and S4 of electrode 1 and electrode 3, 5, and vias 610a, 620a, 630a and 640a are electrically isolated from electrodes 1, 3 and 5. Each one of the four isolation-rings or insulative openings formed on electrode 1 may be placed in each of the four sections of electrode 1. As shown in FIGS. 6(e), (h) and (j), vias 610a, 620a, 630a and 640a are coupled with electrodes 2, 4 and 6, and vias 610b, 620b, 630b and 640b are electrically isolated from electrodes 2, 4 and 6. FIGS. 6(d) and (g) show that all eight vias of capacitor 600 may be coupled (non-conductively) with the dielectric layers (such as DL1 and DL2 as illustrated), which are sandwiched between every two layers of the six electrodes. In some embodiments, vias 610a, 620a, 630a and 640a may be electrically connected to a power source and vias 610b, 620b, 630b and 640b may be electrically connected to ground.

Figure 7:
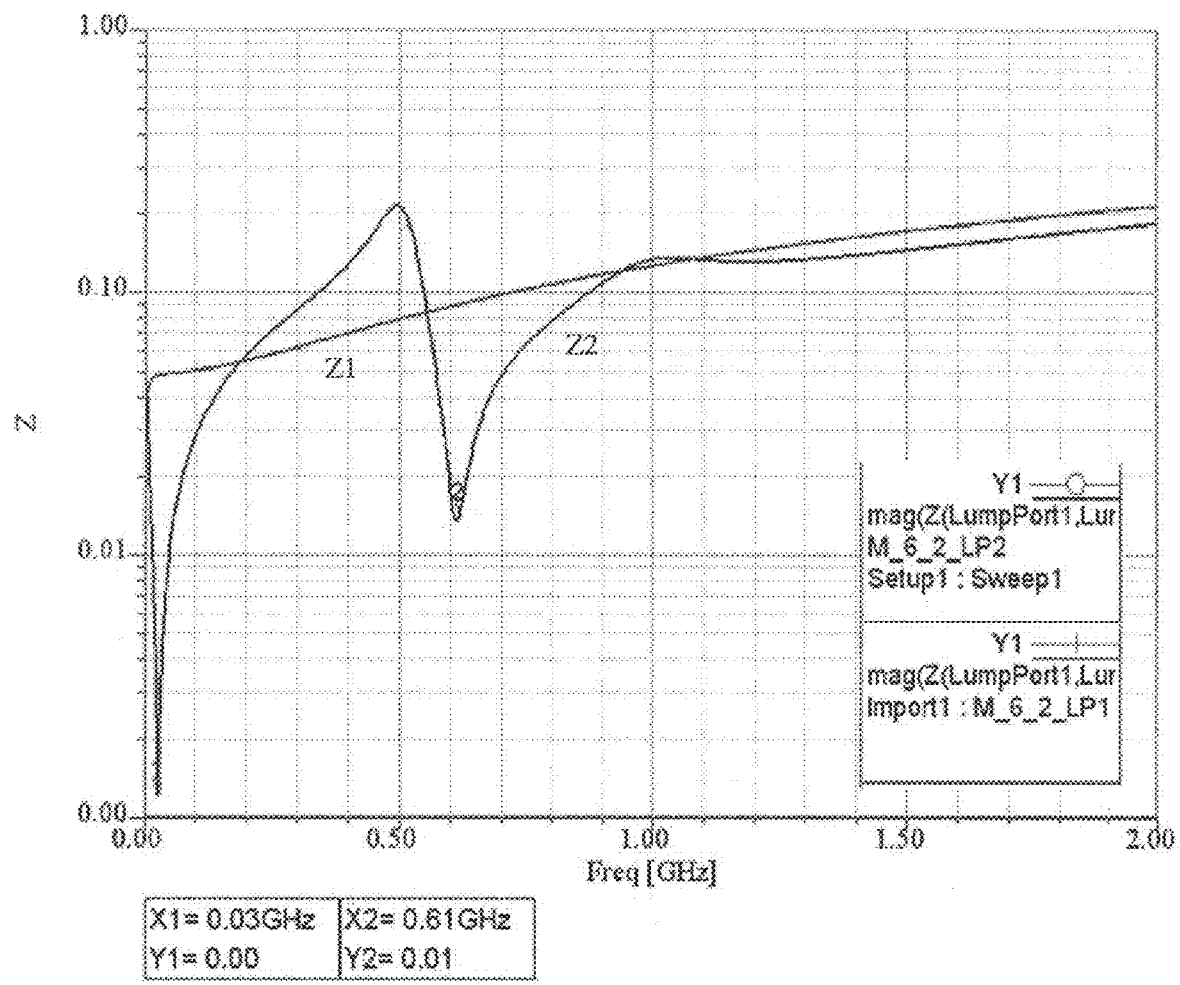
FIG. 7 illustrates exemplary impedance curves of the multilayer capacitor illustrated in FIG. 5(a), consistent with disclosed embodiments.

FIG. 7 illustrates exemplary impedance curves simulated based on the structure of capacitor 500 as illustrated in FIG. 5(a). Z1 is the impedance curve extracted from section S1 of electrode 1 of capacitor 500. Z2 is the impedance curve extracted from section S2 of electrode 1 of capacitor 500. Values for C1 and C2 are obtained by using the following parameters for capacitor 500: DK1=300, DK2=10, DK3=300 and DK4=DK5=DK6=300. In software simulation, the capacitance C1 extracted from section S1 of electrode 1 of capacitor 500 is 774 nF and the capacitance C2 extracted from section S2 of electrode 1 of capacitor 500 is 781 nF, not shown in FIG. 7. As shown in FIG. 7, although values of C1 and C2 are approximately the same, their impedance curves Z1 and Z2 are significantly different. Z1 shows only one resonant frequency below about 0.7 GHz, while Z2 yields two resonant frequencies of about 0.6 GHz and about 0.03 GHz with much lower impedance values. Therefore, FIG. 7 illustrates that a multilayer capacitor, such as capacitor 500, may provide multiple resonant frequencies without the need of adjusting or sacrificing capacitance.

Figure 8:
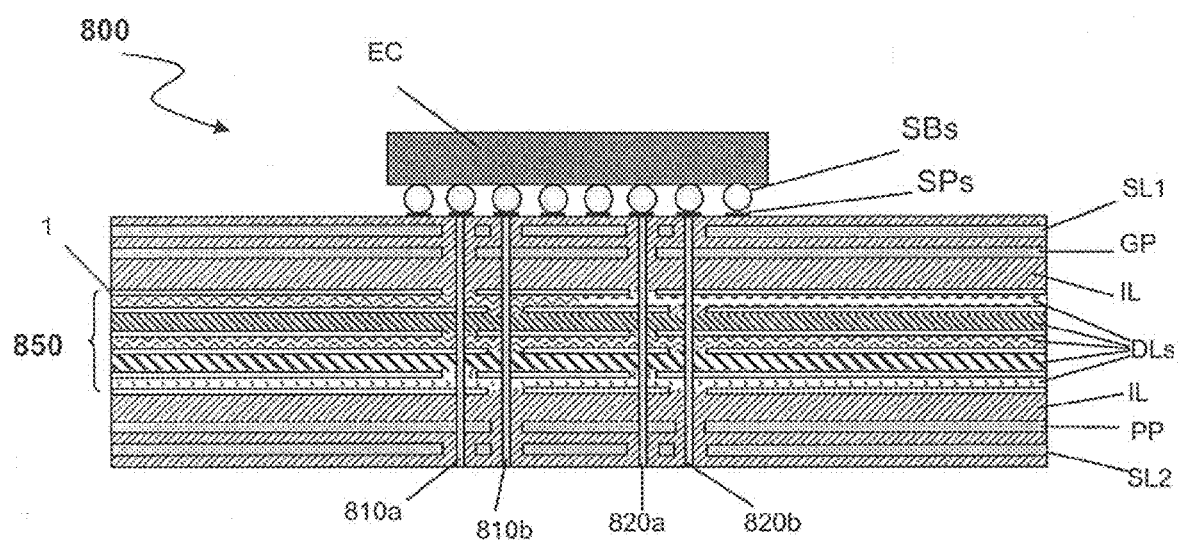
FIG. 8 illustrates a cross-sectional view of an exemplary multilayer capacitor embedded in an IC substrate or a PCB, consistent with disclosed embodiments.

FIG. 8 illustrates a cross-sectional view of an exemplary multilayer capacitor embedded in an IC substrate or a PCB. Electronic package module 800 may include a PCB or an IC-carrying substrate. As shown in FIG. 8, capacitor 850 may be a multilayer capacitor embedded into electronic package module 800, which also may include two wiring layers SL1 and SL2, a ground plane GP, a power plane PP and two insulating layers IL. Capacitor 850 may have six layers of electrodes and five dielectric layers as illustrated in FIG. 8. In some embodiments, capacitor 850 may have the same or a similar structure as capacitor 500 illustrated in FIG. 5(a). Capacitor 850 may have the same or a similar structure as capacitor 600 illustrated in FIGS. 6(a)-(b). Vias 810a and 820a may be electrically connected to power plane PP, and vias 810b and 820b may be connected to ground plane GP. As shown in FIG. 8, all four vias may couple alternating layers of electrodes of capacitor 850 the same way as vias do for capacitor 500 and capacitor 600 illustrated above. In addition, vias 810a, 810b, 820a and 820b may be connected to electronic component EC, such as an integrated circuit (IC) or other circuitry or devices, through known bonding techniques, such as solder pads SPs and solder balls SBs.

Figure 9A:
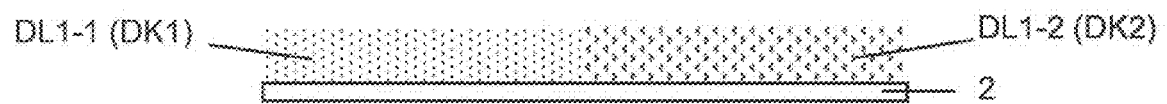
FIGS. 9(a)-(e) illustrate an exemplary method for forming a multilayer capacitor, consistent with disclosed embodiments.
Figure 9B:
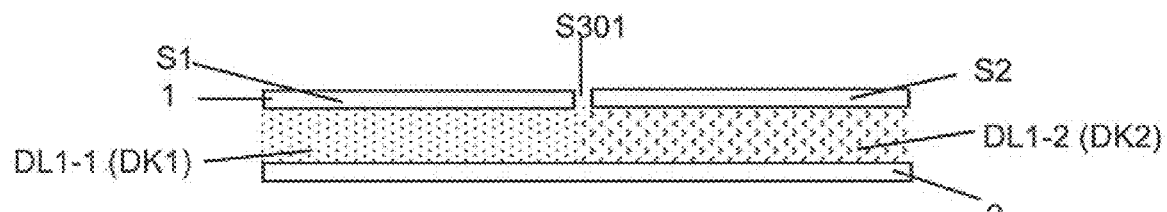
Figure 9C:
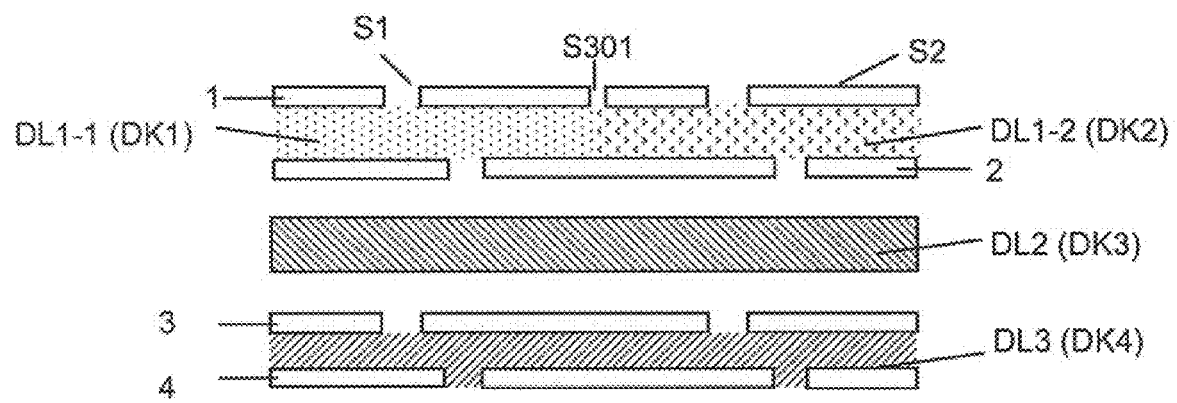
Figure 9D:
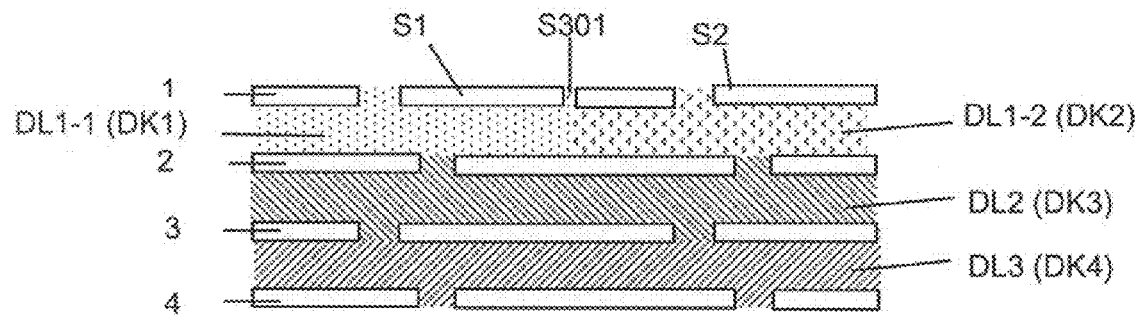
Figure 9E:
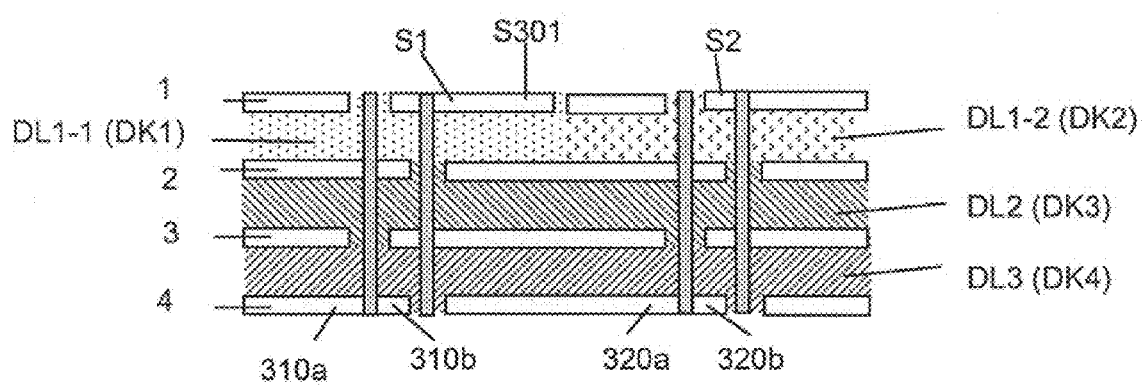

FIGS. 9(a)-(e) illustrate an exemplary method for forming capacitor 300 illustrated in FIG. 3(a). As shown in FIG. 9(a), dielectric layer with two sections (DL1-1 and DL1-2), respectively having dielectric constants DK1 and DK2, may be applied onto electrode 2 using an ink-jet printing or coating process. DK1 and DK2 may have different values but the same thickness. As shown in FIG. 9(b), sections S1 and S2 of electrode 1 may be made by electroplating on top of the dielectric layers DL1-1 and DL1-2, respectively. In some embodiments, the electrode or sections of electrodes may be formed using a lithography process. An exemplary lithography process may include steps such as forming a photoresist over an electrode, defining electrode or section patterns by exposing the photoresist to light through a pattern-defining mask, developing the photoresist, and etching or removing part of the electrode by using the developed photoresist as a mask. Other lithography or pattern-defining process may be applied as an alternative way of defining electrode or section patterns. In some embodiments, sections S1 and S2 may be physically separated by slot S301, which may be filled with dielectric materials. Thus, a two-layer capacitor substrate may be formed, as shown in FIG. 9(*b*).

As shown in FIG. 9(*c*), dielectric layer DL3, electrode 3 and electrode 4 may also form a two-layer capacitor substrate using either the technique described above for FIGS. 9(*a*)-(*b*) or any conventional technique for making a PCB. Isolation-rings or insulative openings may be made in each of electrodes 1, 2, 3 and 4. In some embodiments, the insulative openings may be made by etching, mechanical or laser drilling process. In some embodiments, DL2 may be selected such that its dielectric constant DK3 is at least five times larger than at least one of DK1 and DK2.

As shown in FIG. 9(*d*), the two-layer capacitor substrate formed by electrode 1, electrode 2, DL1-1 and DL1-2, and the two-layer capacitor substrate formed by electrode 3, electrode 4 and DL3, may be laminated together with DL2 in between to form the four-layer capacitor 300. As shown in FIG. 9(*e*), vias 310*a*, 310*b*, 320*a* and 320*b* may be formed in capacitor 300 using a drilling process and electroplating or electroless plating. In some embodiments, capacitor 300 may be embedded in a silicon substrate, the dielectric layers may be made using plasma chemical vapor deposition ("CVD") method, and the electrodes may be made by using a sputtering or a deposition method. It is to be noted again that the steps, including the order of the steps, shown in FIGS. 9(*a*)-(*e*) are only illustrative of one exemplary method of forming a multilayer capacitor module.

It will be apparent to those skilled in the art that various modifications and variations can be made in the light-emitting systems and devices. For example, although the exemplary multilayer capacitors discussed in the specification only comprise three to six layers of electrodes, it will be apparent to one skilled in the art to design such multilayer capacitors with additional layers of electrodes, with or without sub-sections for each layer. It is intended that the embodiments described be considered as exemplary only, with the true scope of the embodiments being indicated by the following claims and their equivalents.

What is claimed is:

1. A capacitor device comprising:
   a first electrode coupled with a first terminal of the capacitor device;
   a second electrode under the first electrode and coupled with a second terminal of the capacitor device, the second electrode being electrically isolated from the first electrode;
   a third electrode under the first electrode and the second electrode, the third electrode being electrically isolated from the second electrode and being electrically coupled with the first electrode;
   a first dielectric layer having at least one first dielectric constant, the first dielectric layer being sandwiched between the first electrode and the second electrode; and
   a second dielectric layer having a second dielectric constant, the second dielectric layer being sandwiched between the second electrode and the third electrode, wherein the second dielectric constant is at least five times larger than the first dielectric constant.

2. The capacitor device of claim 1, further comprising:
   a fourth electrode under the third electrode, the fourth electrode being electrically isolated from the third electrode and being electrically coupled with the second electrode; and
   a third dielectric layer having a third dielectric constant, the third dielectric layer being sandwiched between the third electrode and the fourth electrode.

3. The capacitor device of claim 1, wherein at least one of the first, second, and third electrode comprises a metal foil.

4. The capacitor device of claim 1 further comprising:
   a first via electrically coupled between the first electrode and the third electrode, the first via passing through an insulative opening in the second electrode without electrically conducting with the second electrode and being electrically coupled to the first terminal; and
   a second via electrically coupled to the second electrode, the second via passing through an insulative opening in at least one of the first electrode and the third electrode without electrically conducting with the first electrode or the third electrode and being electrically coupled to the second terminal.

5. The capacitor device of claim 1, wherein one of the first terminal and the second terminal is electrically coupled with a power source, and the other of the first terminal and the second terminal is electrically coupled with a ground.

6. The capacitor device of claim 1, wherein the first electrode has at least two sections physically separated from each other, the first dielectric layer providing the first dielectric constant under a first section of the first electrode and a second sectional dielectric constant under a second section of the first electrode, the second sectional dielectric constant being different from the first dielectric constant.

7. The capacitor device of claim 6, wherein the second sectional dielectric constant is the same or smaller than the second dielectric constant.

8. The capacitor device of claim 6, wherein the at least two sections of the first electrode are physically separated by at least one slot, the at least one slot is filled with dielectric materials.

9. The capacitor device of claim 6, further comprising:
   a first sectional via electrically coupled between the first section of the first electrode and the third electrode, the first sectional via passing through an insulative opening in the second electrode without electrically conducting with the second electrode and being electrically coupled to the first terminal;
   a second sectional via electrically coupled to the second electrode, the second sectional via passing through an insulative opening in at least one of the first section of the first electrode and the third electrode without electrically conducting with the first section of the first or the third electrode and being electrically coupled to the second terminal;
   a third sectional via electrically coupled between the second section of the first electrode and the third electrode, the third sectional via passing through another insulative opening in the second electrode without electrically conducting with the second electrode and being electrically coupled to the first terminal; and
   a fourth sectional via electrically coupled to the second electrode, the second sectional via passing through another insulative opening in at least one of the second section of the first electrode and the third electrode without electrically conducting with the second section of the first or the third electrode and being electrically coupled to the second terminal.

10. The capacitor device of claim 1, wherein the capacitor device is embedded within at least one of a printed circuit board and an integrated circuit substrate as an embedded decoupling capacitor.

11. A capacitor device comprising:
a first electrode coupled with a first terminal of the capacitor device;
a second electrode under the first electrode and coupled with a second terminal of the capacitor device, the second electrode being electrically isolated from the first electrode;
a third electrode under the first electrode and the second electrode, the third electrode being electrically isolated from the second electrode and being electrically coupled with the first electrode;
a first dielectric layer having at least one first dielectric constant, the first dielectric layer being sandwiched between the first electrode and the second electrode; and
a second dielectric layer having a second dielectric constant, the second dielectric layer being sandwiched between the second electrode and the third electrode, wherein the second dielectric constant is no less than five times the first dielectric constant;
a fourth electrode under the third electrode, the fourth electrode being electrically isolated from the first and the third electrode and being electrically coupled with the second electrode; and
a third dielectric layer having a third dielectric constant, the third dielectric layer being sandwiched between the third electrode and the fourth electrode.

12. The capacitor device of claim 11, wherein at least one of the first, second, and third electrode comprises a copper foil.

13. The capacitor device of claim 11 further comprising:
a first via electrically coupled between the first electrode and the third electrode, the first via passing through an insulative opening in the second electrode without electrically conducting with the second electrode and being electrically coupled to the first terminal; and
a second via electrically coupled to the second electrode and the fourth electrode, the second via passing through an insulative opening in at least one of the first electrode and the third electrode without electrically conducting with the first electrode and the third electrode, and being electrically coupled to the second terminal and the fourth electrode.

14. The capacitor device of claim 11, wherein one of the first terminal and the second terminal is electrically coupled with a power source, and the other of the first terminal and the second terminal is electrically coupled with a ground.

15. The capacitor device of claim 11, wherein the first electrode has at least two sections physically separated, the first dielectric layer providing the first dielectric constant under a first section of the first electrode and a second sectional dielectric constant under a second section of the first electrode, the second sectional dielectric constant being different from the first dielectric constant.

16. The capacitor device of claim 15, wherein the second sectional dielectric constant is the same or smaller than the second dielectric constant.

17. The capacitor device of claim 15, wherein the at least two sections of the first electrode are physically separated by at least one slot, the at least one slot is filled with dielectric materials.

18. The capacitor device of claim 15, further comprising:
a first sectional via electrically coupled between the first section of the first electrode and the third electrode, the first sectional via passing through an insulative opening in the second electrode without electrically conducting with the second electrode and being electrically coupled to the first terminal;
a second sectional via electrically coupled to the second and the fourth electrode, the second sectional via passing through an insulative opening in at least one of the first section of the first electrode and the third electrode without electrically conducting with the first section of the first and the third electrode, and being electrically coupled to the second terminal;
a third sectional via electrically coupled between the second section of the first electrode and the third electrode, the third sectional via passing through another insulative opening in the second electrode without electrically conducting with the second and the fourth electrode, and being electrically coupled to the first terminal; and
a fourth sectional via electrically coupled to the second and the fourth electrode, the second via passing through another insulative opening in at least one of the second section of the first electrode and the third electrode without electrically conducting with the second section of the first and the third electrode, and being electrically coupled to the second terminal.

19. The capacitor device of claim 15, wherein the capacitor device is embedded within at least one of a printed circuit board and an integrated circuit substrate as an embedded decoupling capacitor.

20. A method for forming a capacitor device, the method comprising:
providing a first electrode;
providing a second electrode under the first electrode, the second electrode being electrically isolated from the first electrode;
forming a first dielectric layer, having at least one first dielectric constant, between the first electrode and the second electrode;
providing a third electrode under the first electrode and the second electrode, the third electrode being electrically isolated from the second electrode and being electrically coupled with the first electrode;
forming a second dielectric layer, having a second dielectric constant, between the second electrode and the third electrode, wherein the second dielectric constant is at least five times larger than the first dielectric constant;
forming a first electrical coupling between the first electrode and a first terminal of the capacitor device; and
forming a second electrical coupling between the second electrode and a second terminal of the capacitor device.

21. The method of claim 20, further comprising:
providing a fourth electrode under the third electrode, the fourth electrode being electrically isolated from the first and the third electrode and being electrically coupled with the second electrode; and
providing a third dielectric layer, having a third dielectric constant, between the third electrode and the fourth electrode.

22. The method of claim 20, wherein at least one of the first, second, and third electrodes comprises a metal foil.

23. The method of claim 20, further comprising:
providing an insulative opening in the second electrode;
providing an insulative opening in the first electrode;
providing an insulative opening in the third electrode;
electrically coupling a first via with the first electrode, the third electrode, and the first terminal, the first via being configured to pass through the insulative opening in the second electrode without being electrically coupled with the second electrode; and electrically coupling a second via with the second electrode and the second terminal, the second via being configured to pass through at least one of the insulative openings in the first and the third electrodes without being electrically coupled with the first electrode or the third electrode.

24. The method of claim 20, further comprising:

electrically coupling one of the first terminal and the second terminal with a power source, and electrically coupling the other of the first terminal and the second terminal with a ground.

25. The method of claim 20, further comprising:

providing at least two sections within the first electrode physically separated from each other, the first dielectric layer being configured to provide the first dielectric constant under a first section of the first electrode and a second sectional dielectric constant under a second section of the first electrode, wherein the second sectional dielectric constant is different from the first dielectric constant.

26. The method of claim 25, further comprising:

providing at least a first and a second insulative opening in the second electrode;

providing an insulative opening in the first section of the first electrode;

providing an insulative opening in the second section of the first electrode;

providing at least a first and a second insulative opening in the third electrode;

electrically coupling a first sectional via with the first section of the first electrode, the third electrode, and the first terminal, the first sectional via being configured to pass through the first insulative opening in the second electrode without being electrically coupled with the second electrode;

electrically coupling a second sectional via with the second electrode and the second terminal, the second sectional via being configured to pass through at least one of the insulative opening in the first section of the first electrode and the first insulative opening in the third electrode without being electrically coupled with the first section of the first and the third electrode;

electrically coupling a third sectional via with the second section of the first electrode, the third electrode, and the first terminal, the third sectional via being configured to pass through the second insulative opening in the second electrode without being electrically coupled with the second electrode; and electrically coupling a fourth sectional via with the second electrode and the second terminal, the fourth sectional via being configured to pass through at least one of the insulative opening in the second section of the first electrode and the second insulative opening in the third electrode without being electrically coupled with the second section of the first and the third electrode.

27. The method of claim 20, further comprising embedding the capacitor device within at least one of a printed circuit board and an integrated circuit substrate as an embedded decoupling capacitor.

* * * * *